(12) United States Patent
Yin et al.

(10) Patent No.: US 7,999,322 B2
(45) Date of Patent: Aug. 16, 2011

(54) POLY-SI THIN FILM TRANSISTOR AND ORGANIC LIGHT-EMITTING DISPLAY HAVING THE SAME

(75) Inventors: Huaxiang Yin, Yongin-si (KR); Takashi Noguchi, Yongin-si (KR); Hyuk Lim, Seoul (KR); Wenxu Xianyu, Suwon-si (KR); Hans S. Cho, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/947,002

(22) Filed: Nov. 16, 2010

(65) Prior Publication Data
US 2011/0057195 A1 Mar. 10, 2011

Related U.S. Application Data

(62) Division of application No. 11/561,572, filed on Nov. 20, 2006, now Pat. No. 7,859,054.

(30) Foreign Application Priority Data

Dec. 2, 2005 (KR) .......................... 10-2005-0116887

(51) Int. Cl.
*H01L 27/12* (2006.01)
(52) U.S. Cl. ................................ 257/347; 257/E21.561
(58) Field of Classification Search .......... 257/347–354, 257/E21.561
See application file for complete search history.

(56) References Cited

U.S. PATENT DOCUMENTS

| 5,198,379 | A | 3/1993 | Adan |
| 6,322,625 | B2 | 11/2001 | Im |
| 7,041,540 | B1 | 5/2006 | Chang et al. |
| 7,859,054 | B2 * | 12/2010 | Yin et al. ...................... 257/347 |
| 2006/0043375 | A1 | 3/2006 | Takasugi et al. |
| 2008/0166860 | A1 | 7/2008 | Yamazaki et al. |

OTHER PUBLICATIONS

"Temperature Dependence of the Anomalous Leakage Current in Polysilicon-on-Insulator MOSFET's"; Authors: Bhattacharya, et al.; IEEE Transactions on Electron Devices; vol. 41, No. 2, pp. 221-227, Feb. 1994.
"Anomalous Leakage Current in LPCVD Polysilicon MOSFET's"; Authors: Fossum; et al.; IEEE Transactions on Electron Devices, vol. ED-32, No. 9, pp. 1878-1884, Sep. 1985.
Rodder et al.; "Comparison of Different Techniques for Passivation of Small-Grain Polycrystalline-Si MOSFET3 s"; IEEE Electron Device Letters, vol. EDL-6, No. 11, Nov. 1985, pp. 570-572.

* cited by examiner

*Primary Examiner* — Richard A. Booth
(74) *Attorney, Agent, or Firm* — Cantor Colburn LLP

(57) ABSTRACT

A thin film transistor comprises an Si-based channel having a nonlinear electron-moving path, a source and a drain disposed at both sides of the channel, a gate disposed above the channel, an insulator interposed between the channel and the gate, and a substrate supporting the channel and the source and the drain disposed at either side of the channel respectively.

18 Claims, 6 Drawing Sheets

$W_S > W_D$

POLY-SI THIN FILM TRANSISTOR AND ORGANIC LIGHT-EMITTING DISPLAY HAVING THE SAME

This application is a divisional of U.S. application Ser. No. 11/561,572, filed on Nov. 20, 2006, which claims priority to Korean Patent Application No. 10-2005-0116887, filed on Dec. 2, 2005, and all the benefits accruing therefrom under 35 U.S.C. §119, the contents of which in its entirety are herein incorporated by reference.

BACKGROUND OF THE INVENTION

1. Field of the Invention

The present invention relates to a poly-Si thin film transistor ("TFT") and an organic light-emitting display having the same.

2. Description of the Related Art

Polycrystalline silicon ("p-Si") has higher electron mobility than that of amorphous silicon ("a-Si") and has good optical stability. P-Si has been widely used in a variety of fields, and in particular, in thin film transistors ("TFTs") or memory devices. P-Si TFTs have been used as switching devices in display devices, for example. Display devices using an active device such as a TFT include TFT liquid crystal displays ("LCDs") and TFT organic light-emitting displays ("OLEDs").

TFT LCDs or TFT OLEDs have a structure in which pixels are arranged in the form of an X-Y matrix, and a TFT is disposed in each pixel. The performance of LCDs and OLEDs in which a plurality of TFTs are arranged largely depends on electrical characteristics of the TFT. One of the most important aspects to the functionality of a TFT is the electron mobility of an Si active layer. Crystallization is essential to improve the electron mobility of the Si active layer. U.S. Pat. No. 6,322,625 discloses a method of fabricating silicon crystal with excellent electron mobility characteristics. The field of study of silicon crystallization has been rapidly developed so that a crystalline structure approaching single crystallization, or the state where the crystal lattice of a sample of the crystal is continuous and unbroken to the edges of the sample, can be obtained.

One of the disadvantages of a p-Si TFT includes a high rate of current leakage through the TFT when an off signal is sent to the gate terminal thereof. In the p-Si TFT, it is well known that leakage of a current occurs by grain boundary traps in a depletion region of a drain (see Ferry G. Fossum, et al., IEEE Trans. Electron Devices, Vol. ED-32, pp. 1878-1884, 1985).

An offset structure has been proposed to more effectively reduce a leakage current (see M. Rodder et al., IEEE Electron Device Letters, Vol. EDL-6, No. 11, November 1985). An offset region is a lightly doped drain ("LDD") and is disposed between a channel and a gate or between the channel and a drain, respectively. The LDD lowers an electric field of the drain and reduces field emission caused by a gate voltage and a drain voltage. However, in order to form the offset structure, a local differential doping process using an additional mask is required. In order to successfully perform differential doping in an offset region using the mask, the mask should be precisely aligned on the substrate. However, since an additional mask is used in the above method, the doping process becomes more complicated, yield is reduced and productivity is lowered.

A variety of methods of reducing a reverse leakage current using an LDD are well known. For example, a large gate can reduce a leakage current. However, the size of a light-emitting region within a pixel is of a limited area and a larger gate inevitably reduces that area and therefore the luminous efficiency of a device using large gates is lowered. Alternative methods of reducing the leakage current such as fabricating a dual gate TFT are complicated and manufacturing costs thereof are high. In an OLED, although reduction in a leakage current using an additional circuit in each switching TFT of a pixel is possible, the additional circuit includes an additional device such as a TFT, thus increasing manufacturing costs greatly.

BRIEF SUMMARY OF THE INVENTION

The present invention provides a polycrystalline silicon ("p-Si") thin film transistor ("TFT") which has properly-adjusted electron mobility so that a leakage current can be effectively reduced, and an organic light-emitting display having the same.

According to an exemplary embodiment of the present invention, a thin film transistor includes an Si-based channel having a nonlinear electron-moving path; a source and a drain disposed on either side of the channel, respectively, a gate disposed above the channel, an insulator interposed between the channel and the gate, and a substrate supporting the channel, the source and the drain.

An exemplary embodiment of the channel includes a plurality of bent portions wherein the bent portions are formed on either side of a gate to form a crank shape.

An exemplary embodiment of the channel includes a plurality of bent portions wherein the bent portions are formed on the same side of a gate to form a U shape.

An exemplary embodiment of the thin film transistor includes a channel width of the drain which is narrower than that of the source.

According to another exemplary embodiment of the present invention, an organic light-emitting display includes; a substrate, a scanning signal line and a driving signal line disposed on the substrate in a matrix pattern, a switching transistor and a driving transistor disposed in a pixel region defined by the scanning signal line and the driving signal line, wherein the switching transistor is connected to the scanning signal line and the driving signal line and the driving transistor is driven by the switching transistor, and an organic light-emitting diode operated by the driving transistor, wherein the switching transistor comprises; an Si-based channel having a nonlinear electron-moving path, a source and a drain disposed on either side of the channel respectively, and a gate disposed above the channel.

According to another exemplary embodiment of the present invention, a method of manufacturing a thin film transistor includes; forming an Si-based channel having a nonlinear electron-moving path on a substrate, forming a source and a drain disposed on either side of the channel, respectively, forming a gate disposed above the channel, and forming an insulator interposed between the channel and the gate.

BRIEF DESCRIPTION OF THE DRAWINGS

The above and other aspects, features and advantages of the present invention will become more apparent by describing in more detail exemplary embodiments thereof with reference to the attached drawings in which.

DETAILED DESCRIPTION OF THE INVENTION

Figure 1A:
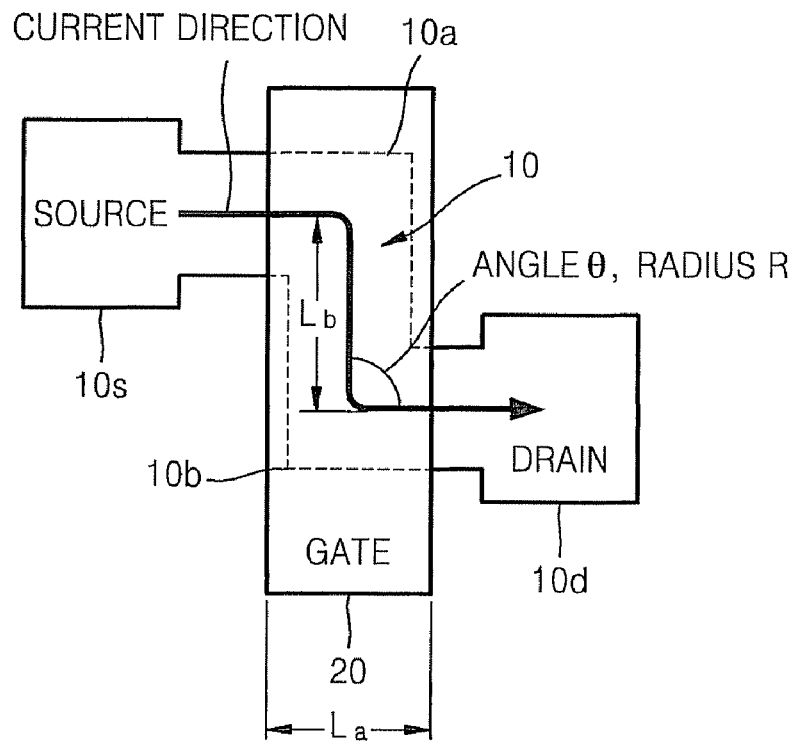
FIGS. 1A through 1C are top plan view layout diagrams of exemplary embodiments of a polycrystalline silicon ("p-Si") thin film transistor ("TFT") having asymmetrical channels according to the present invention.

Hereinafter, the present invention will be described more fully with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, lengths and sizes of layers and regions may be exaggerated for clarity.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "below" or "lower" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
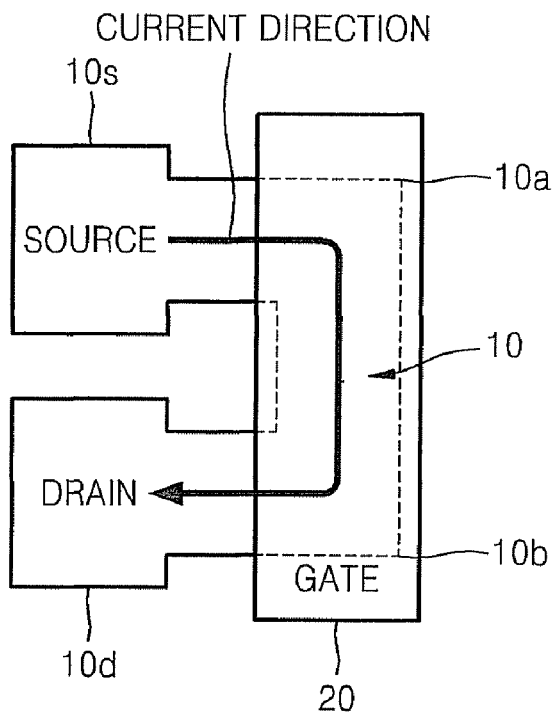
Figure 1C:
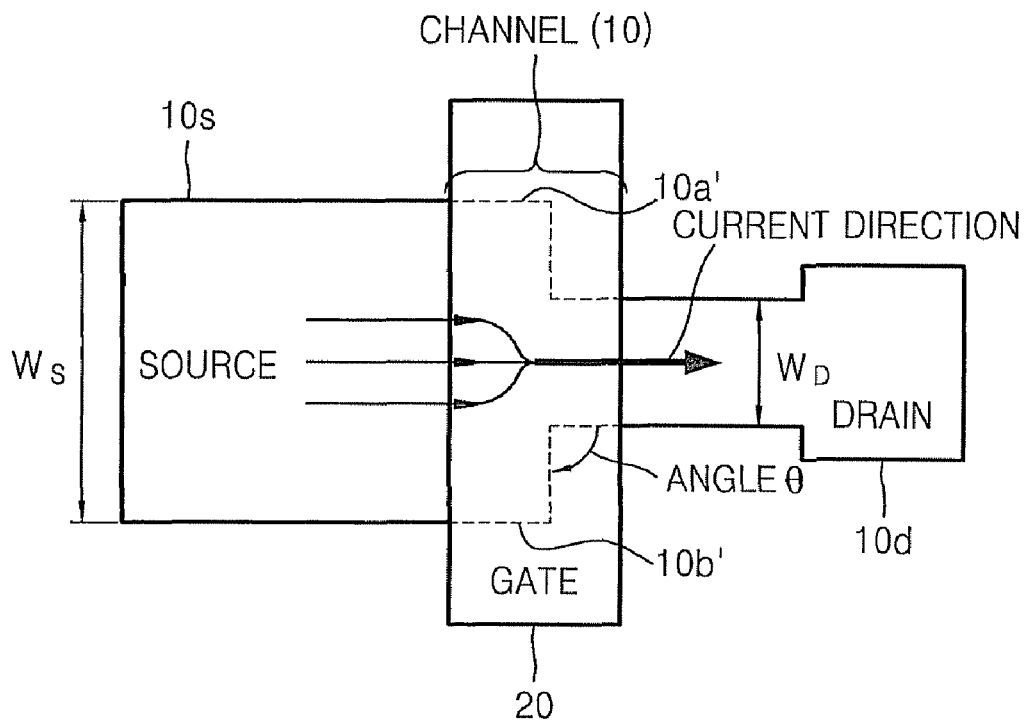

FIGS. 1A through 1C are top plan view layout diagrams of an exemplary embodiment of a polycrystalline silicon ("p-Si") thin film transistor ("TFT") having asymmetrical channels according to the present invention.

FIG. 1A illustrates a transistor in which a channel 10 is formed asymmetrically centering around a gate 20. The channel 10 has two bent portions 10a and 10b in an offset or crank shape (e.g., as in a one-piece bicycle crank). The gate 20 passes over a middle portion of the channel 10 having the two bent portions 10a and 10b. A source 10s and a drain 10d are disposed on both ends of the channel 10. The channel has a nonlinear electron-moving path (illustrated by an arrow) due to the two bent portions 10a and 10b. In the present exemplary embodiment shown in FIG. 1A, an inner angle θ of an edge formed on the bent portions 10a and 10b and the rest of the channel portion is substantially perpendicular (about 90 degrees). Alternative exemplary embodiments include configurations where other predetermined angles are maintained. Referring to FIG. 1A, when viewing a gate 20 from above, a flow of electrons is parallel to the source 10s until it reaches the middle of the gate 20, at which point it runs parallel to the longitudinal axis of the gate 20 until it reaches the drain 10d at which point it runs parallel to the longitudinal axis of the drain 10d.

A characteristic of the exemplary embodiments of bent electron-moving paths, as illustrated in FIGS. 1A and 1B, is that electron mobility in a channel is reduced compared to electron mobility in a conventional channel. That is, electron mobility is greater in a channel having a straight line-shaped electron-moving path. The channel according to an exemplary embodiment of the present invention is a p-Si channel which causes electron mobility to be degraded through the above-described asymmetrical or nonlinear electron-moving path and reduces or effectively eliminates reverse leakage current during an off current period.

FIG. 1B illustrates a channel having an asymmetrical electron-moving path having a different shape from the shape illustrated in FIG. 1A. Referring to FIG. 1B, the channel 10 is parallel to the gate 20. A source 10s and a drain 10d of the channel 10 are adjacent and parallel to one another on one side (In the present exemplary embodiment they are on the left side, but alternative exemplary embodiments include placing them on the opposite side) of the gate 20. The channel 10, which is parallel to the gate 20, is formed below the gate 20 and the source 10s and the drain 10d. The source 10s and the drain 10d, which are to be connected to the channel 10, are disposed above and below one side of the gate 20, respectively. In the present embodiment of the present invention, the channel 10 has two bent portions 10a and 10b. Thus, the electron-moving path has a U shape.

FIG. 1C illustrates another exemplary embodiment of a channel 10 having an asymmetrical or a nonlinear electron-moving path having a different shape from the exemplary embodiments illustrated in FIGS. 1A and 1B. Referring to FIG. 1C, the channel 10 extends in one direction and the gate 20 is disposed in a direction that intersects the channel 10. There are no bent portions in the channel of the above-described exemplary embodiment. However, there are stepped portions 10a' and 10b' which make an electron-moving path nonlinear. In the current exemplary embodiment of the present invention, the electron-moving path is non-linear due to a variation in the width of the channel. The current-moving path from the source 10s, which has a wide width WS, extends to a drain 10d, which has a narrow width WD.

The reduction in mobility caused by nonlinearization of the electron-moving path, that is, reduction in mobility caused by the bent or narrowed electron-moving path, and a reduction in current leakage caused thereby, will now be described.

It is well known that reduction in current leakage is proportional to reduction in a drain-source voltage Vds and the width of a channel (S. Bhattacharya et al., IEEE TED Vol. 41, p. 221, 1994). Thus, electron mobility in polycrystalline silicon is adjusted using a method so that a leakage current can be controlled. In the present invention, mobility is reduced by using a nonlinear electron-moving path. Due to the nonlinear electron-moving path, the length of the electron flow channel is extended by having a nonlinear structure as illustrated in the above-described exemplary embodiments by at least the additional length of the structural feature of the extension of the electron-moving path. As such, a so-called "short channel effect", which may be caused by the high integration of a device, can be reduced or effectively prevented.

Currents are formed by movement of free electric charges in a semiconductor. These currents are classified into drift currents formed by an external electric field and diffusion currents formed by a thermal energy and a random motion. In drift currents the electric field causes the electric charges to accelerate until reach to an average speed v due to higher charge bound probability between moving charge and stable charge under higher charge motion speed. While in the non-line channels, a few of the electric charges do not move along electric field lines and are bound in the semiconductor by surface scattering. The direction vary and the average speed of the electric charges (vary) deteriorates. For diffusion currents, the electric charges move in a random motion and pushed by thermal energy and it is also affected by longer diffusion length. However, for drift currents, it is more affected by the direction changing of charge motion.

According to an exemplary embodiment of the present invention, the vector direction of the electric field is changed, and an absolute value thereof is reduced, in the vicinity of a stepped portion or a stair portion of a non-linear channel 10 of a transistor according to the present invention. A reduced electrical force causes a lower average speed of the electric charges.

Furthermore, a portion of the electric charges having an original motion direction is affected by additional bounce or scattering on the surface of the stepped portion or the stair portion of the channel. The electric charges do not move through the channel in a straight line, but rather are bounced and reflected by the surface of the stepped portion or the stair portion of the channel. Thus, the mobility of the electric charges is degraded by an additional barrier of the nonlinear channel. Degradation of mobility induces reduction in a total current of the transistor. Furthermore, a threshold voltage is increased and current leakage is reduced accordingly.

Figure 2:
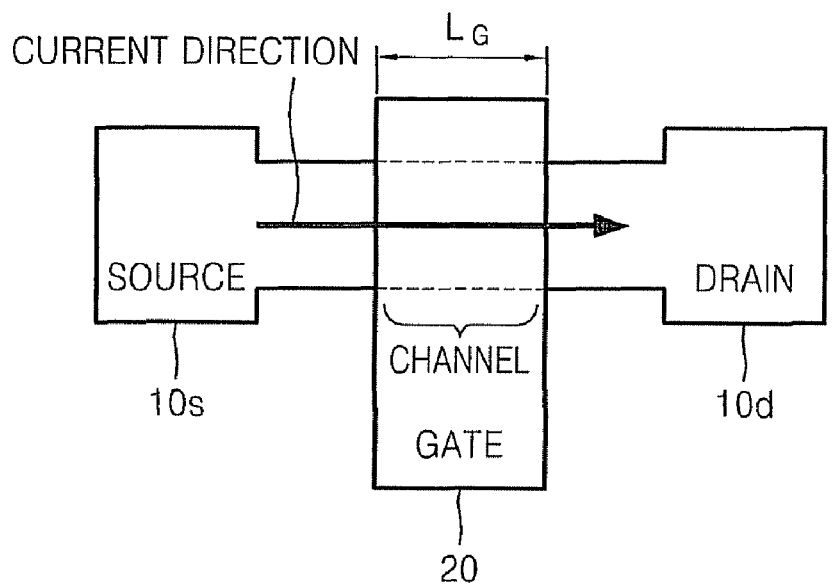
FIG. 2 is a top plan view layout diagram of a channel of a conventional transistor.

FIG. 2 shows a layout of a channel and a gate of a conventional transistor. As illustrated in FIG. 2, in the conventional transistor, the channel is linear and the length of a channel is identical with a width LG of the gate. Thus, in the conventional structure it is seen that there are few barriers to the mobility of electric charges.

Referring to FIG. 1A, as discussed above the channel of the transistor according to the present invention is nonlinear and the path of a current below the gate 20 includes paths in a direction perpendicular to the gate 20 and a path which is substantially parallel to the gate 20. Thus, the length of the path of the current is larger than the width of the gate. As mentioned above, reduction in current leakage in the channel having the abovementioned structure is obtained from two phenomena.

The first phenomena is generation of an additional barrier with respect to carrier movement caused by a direction of a current which is bent into a nonlinear path and an increase in a threshold voltage caused thereby. The second phenomena is extension of the length of the channel caused by the nonlinear path of the current. When the extension of the length of the channel is expressed using an equation, a length L of the channel is approximately a sum of a width of a gate La and a bent path Lb (L=La+Lb) below the gate 20.

Here, the length Lb of the electron-moving path extended below the gate is determined by the following formula:

$$n*R*\theta/2\pi = Lb$$

Here, n is the times at which electrons are bent from source to drain, R is the radius of a bent electron-moving path, and θ is a bend angle. If the electron-moving path is extended, that is, if the length of the channel increases, the drain-source voltage Vds is reduced. Thus, a leakage current is reduced. The reduction in the leakage current occurs similarly in the channel illustrated in FIG. 1B.

The channel illustrated in FIG. 1C has a width which is reduced in a same direction as the forward movement of electrons and a reduction in a leakage current caused by the channel is generated by three phenomena.

Here, first and second phenomena are identical with those illustrated in the structure of FIG. 1A. An additional third phenomenon is the suppression of a leakage current caused by a reduction in drain width. That is, as illustrated in FIG. 1C, a width Wd of the drain is narrower than a width Ws of the source.

The channel according to the present invention is formed of polycrystalline silicon (p-Si). Even though the mobility is reduced to be less than a predetermined level, the channel has sufficiently high mobility to be applied to various types of devices. For example, in the case of an OLED requiring the mobility of about 5-30 cm$^2$/Vs, even though the mobility is reduced to be about 30 cm²/Vs, there is no degradation of the quality of the OLED. Considering this, in the present invention, the mobility is reduced to a degree which does not affect the performance of the device, and a difference of the mobility in different transistors throughout the device is reduced by an amount equal to the reduced mobility so that uniformity of the mobility of a semiconductor device can be increased.

The transistor having the above-described channel can be fabricated by simply changing the shape of a mask for forming a channel without the need for forming an LDD as has been used to adjust mobility in conventional examples. As such, manufacturing costs can be reduced compared to a conventional TFT designed and manufactured to have a low leakage current structure.

Figure 3:
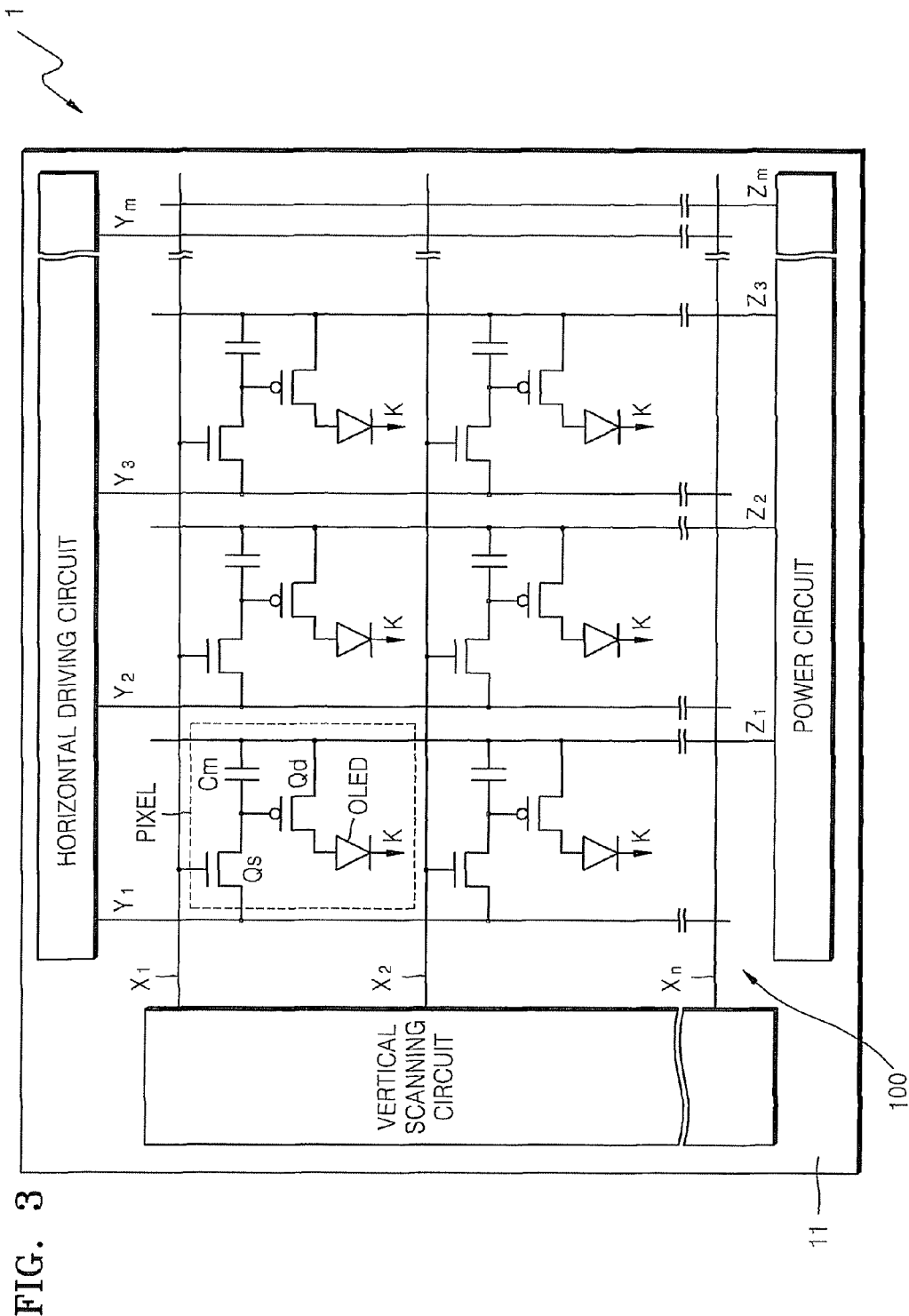
FIG. 3 is an equivalent circuit diagram of an exemplary embodiment of an organic light-emitting display ("OLED") having a thin film transistor ("TFT") according to the present invention.
Figure 4:
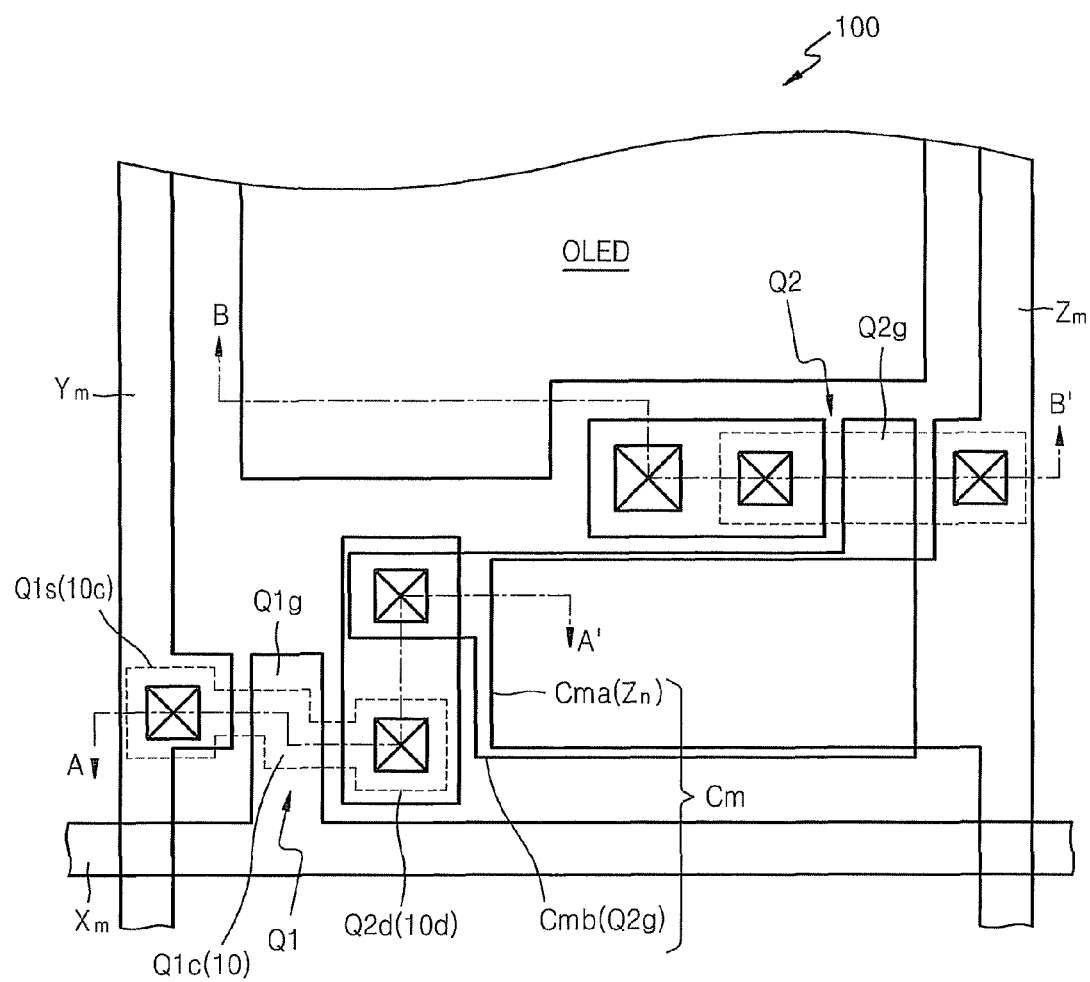
FIG. 4 is a top plan view of an exemplary embodiment of a unit pixel of the exemplary embodiment of the OLED illustrated in FIG. 3.

FIG. 3 is an equivalent circuit diagram of an exemplary embodiment of an OLED 1 having a thin film transistor TFT according to the present invention, and FIG. 4 is a top plan view of an exemplary embodiment of a unit pixel of the exemplary embodiment of the OLED illustrated in FIG. 3.

A plurality of substantially parallel gate lines X1-Xn and a plurality of data lines Y1-Ym are disposed on a substrate 11 to intersect each other so that an X-Y matrix structure is formed. A plurality of power supply lines Z1-Zm are disposed to be parallel to the data lines at regular intervals. A pixel is provided in a region surrounded by the gate lines X1-Xn, the data lines Y1-Ym, and the power supply lines Z1-Zm.

Vertical scanning signals are applied to the gate lines, and horizontal scanning signals, otherwise known as image signals, are applied to the data lines Y1-Ym. The gate lines X1-Xn are connected to a vertical scanning circuit and the data lines Y1-Ym are connected to a horizontal driving circuit. The power supply lines Z1-Zm are connected to a power circuit for an OLED operation.

In the current exemplary embodiment, each pixel includes at least two transistors Q1 and Q2 and one capacitor Cm. In each pixel, a source and a gate of a switching transistor Q1 are connected to one of the data lines Y1-Ym and one of the gate lines X1-Xm, respectively, and a drain of the switching transistor Q2 is connected to a gate of a driving transistor Q2. A memory capacitor Cm in which charges applied by an operation of the switching transistor Q1 are accumulated and image information for each pixel is memorized is connected in parallel to the gate and a source of the driving transistor Q2. An anode of the OLED is connected to a drain of the driving transistor Q2. A cathode K of the OLED corresponds to a common electrode shared by the entire pixel. In the present exemplary embodiment, the switching transistor is an n-type TFT and a driving transistor Qd is a p-type TFT. The transistors are formed of polycrystalline silicon.

In the above structure, the switching transistor Q1 is a semiconductor device having the above-described nonlinear channel and includes channels 10 (hereinafter, Q1c) having the shape of FIG. 1A. Specifically, in the exemplary embodiment illustrated in FIG. 4, the data lines Y1-Ym and the power supply lines Z1-Zm are disposed on right and left sides of a central OLED and are substantially parallel to one another and the gate lines X1-Xn are disposed in a direction which intersects the data lines Y1-Ym and the power supply lines Z1-Zm.

The switching transistor Q1 is disposed in a portion of the unit pixel 100 in which one of the gate lines X1-Xn and one of the data lines Y1-Ym intersect each other, and the driving transistor Q2 is disposed in a portion of the unit pixel 100 in which the one of the gate lines X1-Xn and the power supply lines Z1-Zm intersect each other. The memory capacitor Cm is disposed between the switching transistor Q1 and the driving transistor Q2. One side electrode Cma of the memory capacitor Cm extends from the power supply lines Z1-Zm and the other side electrode Cmb is integrated with a drain Q1d of the switching transistor Q1 and a gate Q2g of the driving transistor Q2.

The gate Q1g of the switching transistor Q1 extends from the gate lines X1-Xn. Exemplary embodiments of the switching transistor Q1 have a nonlinear channel 10 in a crank shape or in a Z shape as described above and the source 10s and the drain 10d are disposed on both ends of the switching transistor Q1. The nonlinear channel 10 may be any one of the exemplary embodiments of channels illustrated in FIGS. 1A through 1C. Layout may be properly changed according to the shape of channels, and in particular, other elements may be disposed according to different positions of the drains. The above layout may be easily changed and the technical scope of the present invention is not limited.

Figure 5:
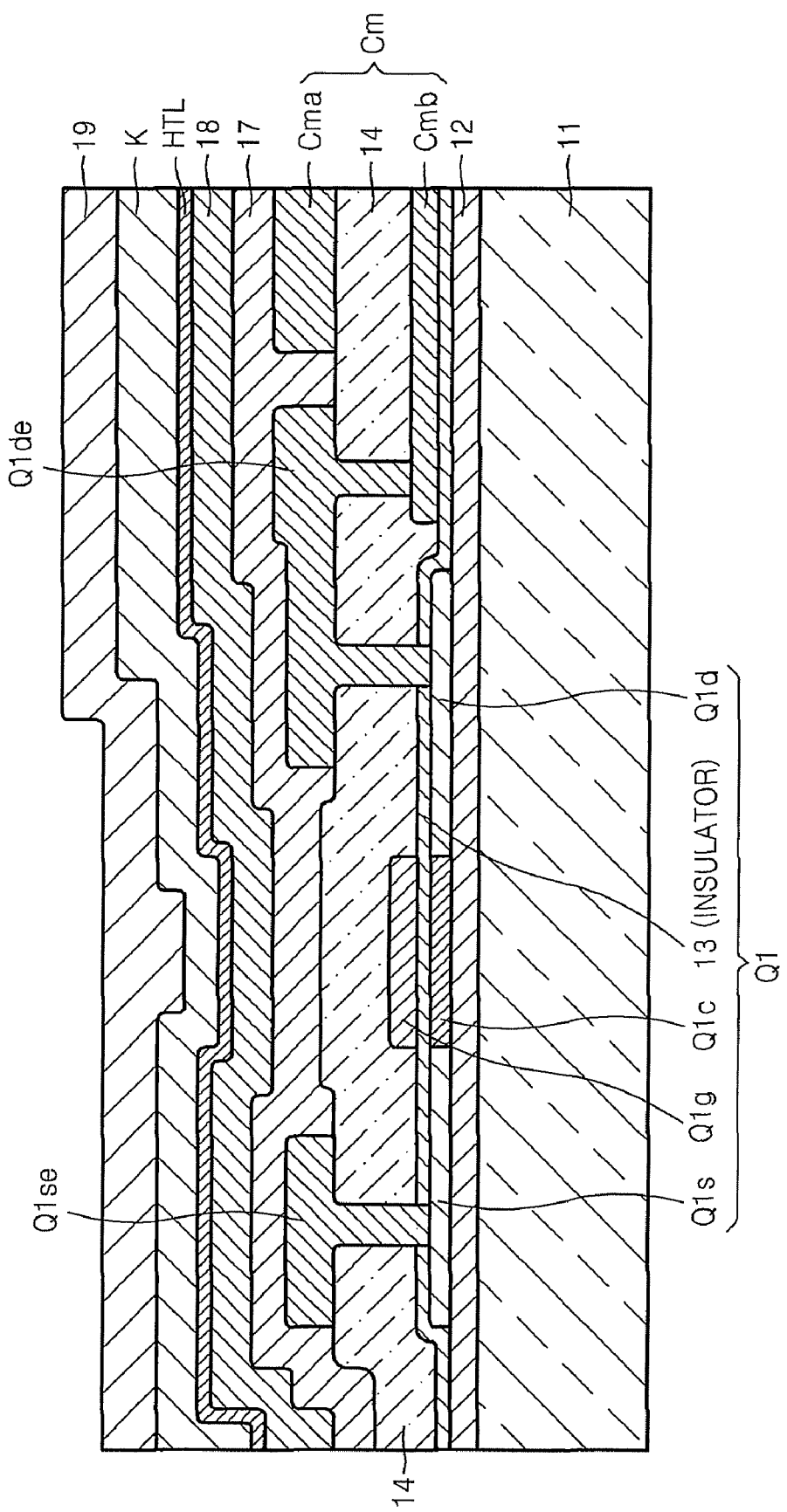
FIG. 5 is a cross-sectional view taken along line A-A' of FIG. 4.

Referring to FIG. 5, which is a cross-sectional view taken along a line A-A' of FIG. 4, a buffer layer 12, comprising an insulating material such as SiON, is formed on the substrate 11. A switching transistor Q1 according to an exemplary embodiment of the present invention is formed on the buffer layer 12. A switching transistor Qs includes a polycrystalline silicon (p-Si) layer having a nonlinear channel 11 (hereinafter, Q1c) formed on the buffer layer 12 and a source 10s (hereinafter, Q1s) and a drain 10d (hereinafter, Q1d) formed on both ends of the channel Q1c, a first insulator 13, comprising SiO2, is formed on the p-Si layer, and a gate Q1g formed on the first insulator 13.

An SiO2 intermetal dielectric ("IMD") 14 is formed on the switching transistor Q1 and a source electrode Q1se and a drain electrode Q1de, comprising a metal, are formed on the SiO2 IMD 14. The source and drain electrode Q1se and Q1de are electrically connected to the source Q1s and the drain Q1d through holes formed in the IMD 14 formed under the source and drain electrode Q1se and Q1de.

The source and drain electrodes Q1s and Q1d, a lower electrode Cmb of the memory capacitor Cm and the power supply lines Z1-Zm may be stacked on one another. In one exemplary embodiment the stacked structure may be made of Mo/Al/Mo or Ti/Al—Cu alloy/Ti. The gate Q1g of the switching transistor Q1 extends from the above-described power supply lines X1-Xm and an exemplary embodiment of which may comprise tungsten.

A portion of the IMD 14 may serve as the dielectric layer of the memory capacitor Cm, and a lower electrode Cmb may be integrated with a gate of the driving transistor Q2. Exemplary embodiments of the lower electrode Cmb may comprise tungsten.

Second and third insulators 17 and 18 are formed on the upper electrode Cma and the source and drain electrodes Q1se and Q1de, which are integrated with the power supply lines Z1-Zm. A hole transport layer ("HTL"), a common electrode K, which functions as a cathode for an OLED, and a fourth insulator 19 are sequentially disposed on the second and third insulators 17 and 18. The fourth insulator 19 acts as a passivation layer for protecting the OLED.

Figure 6:
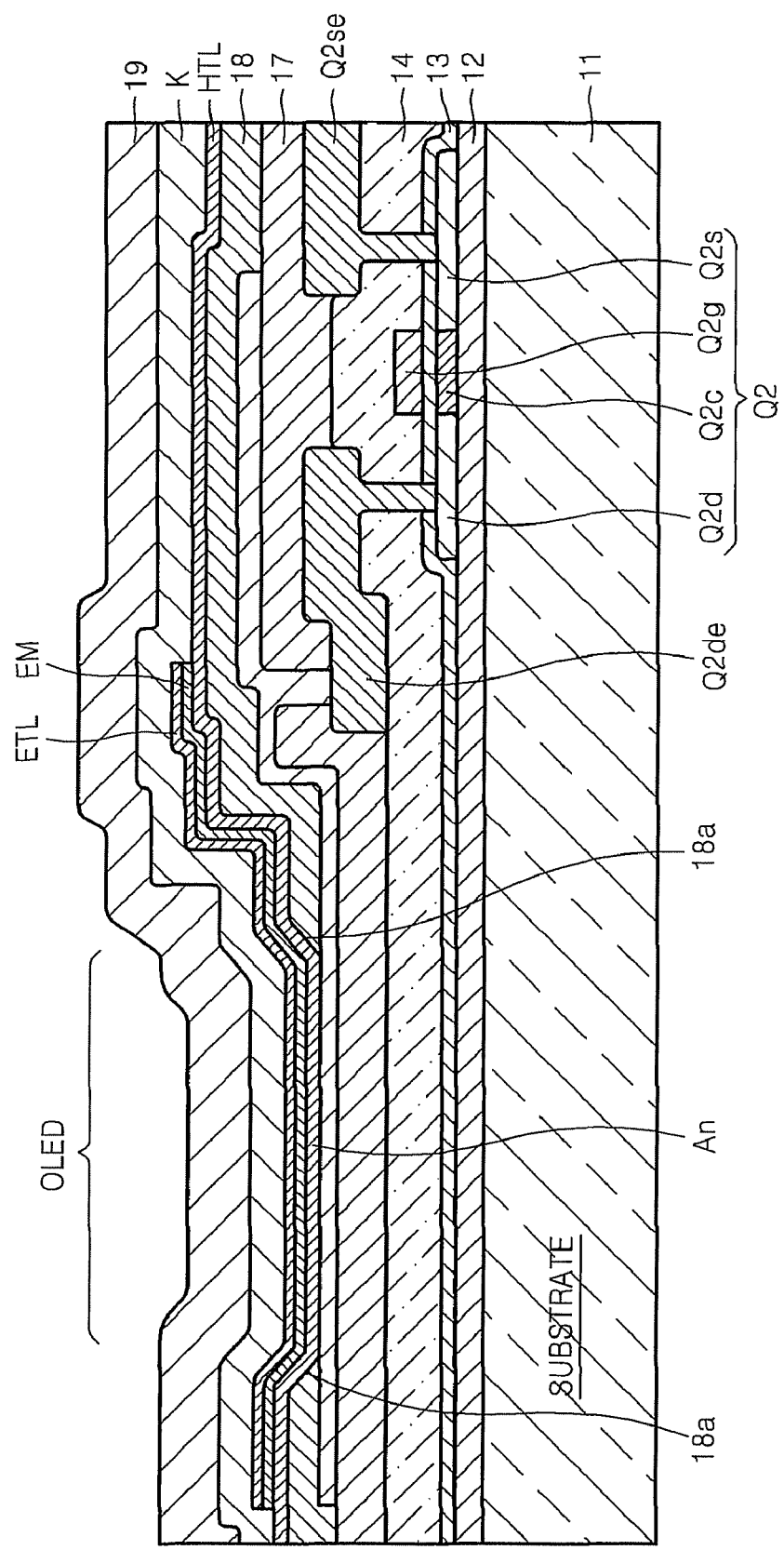
FIG. 6 is a cross-sectional view taken along line B-B' of FIG. 4.

FIG. 6, which is a cross-sectional view taken along line B-B of FIG. 4, illustrates the stack structure of the driving transistor Q2 and the OLED.

A buffer layer 12 is formed on a substrate 11 and a driving transistor Q2 is formed on the buffer layer 12. In one exemplary embodiment, the driving transistor Q2 may be formed simultaneously with the switching transistor Q1. A silicon layer of the driving transistor Q2 may be manufactured from the same material layer as the polycrystalline silicon layer used in manufacturing the switching transistor Qs. The polycrystalline silicon layer includes a source Q2s, a channel Q2c, a drain Q2d. The polycrystalline silicon layer also includes an insulator 13 comprising $SiO_2$ which is formed on the source Q2s, the channel Q2c and the drain Q2d, and a gate Q2g. An exemplary embodiment of the gate Q2g may be integrated with a lower electrode Cmb of a memory capacitor Cm (illustrated in FIG. 5, but not in FIG. 6) and may comprise tungsten.

An $SiO_2$ IMD 14, which also covers the switching transistor Q1 shown in FIG. 5, is formed on the driving transistor Q2. A source electrode Q2se and a drain electrode Q2de are formed on the $SiO_2$ IMD 14 and exemplary embodiments of which may comprise metal. The source and drain electrodes Q2se and Q2de are electrically connected to the source Q2s and the drain Q2d through holes formed in the IMD 14 formed under the source and drain electrode Q2se and Q2de. Second and third insulators 17 and 18 are formed on the source and drain electrodes Q2se and Q2de.

A hole transport layer ("HTL") is formed on the third insulator 18, an emission ("EM") layer and an electron transport layer ("ETL") are formed in a predetermined region of the HTL, and a common electrode K, which functions as a cathode for the OLED, is formed on the EM layer and the ETL. The fourth insulator 19 is formed on the common electrode K. An anode An is disposed between second and third insulators 17 and 18. The anode An is connected to the drain electrode Q2de and is disposed under the OLED. The anode An contacts the HTL by a hole 18a formed on the third insulator 18 in the region of the OLED and is electrically connected to the HTL.

The layout of the field light-emitting display having the above-described structure is just one exemplary embodiment of the present invention and this layout and modification thereof do not limit the technical scope of the present invention.

According to the present invention described above, unnecessarily high mobility in an active region is reduced so that current leakage can be reduced or effectively prevented. The mobility is reduced by extending a channel size in a restricted region, by generating an additional barrier due to a change of path direction and by reducing a drain width. Reduction in current leakage is conducive to an improvement in the quality of a flat display, especially in an OLED, and the reduction in current leakage also functions to reduce manufacturing costs associated with such a display.

The present invention can be applied to a semiconductor device based on polycrystalline silicon, in particular, to any device having a nonlinear active layer with a channel formed by an electric field.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A thin film transistor comprising:
   a channel having a nonlinear electron-moving path, having at least one stepped portion of which a surface reflects and bounces electrons so that the nonlinear electron-moving path is extended in a same direction of a channel length of the channel, and having a first end and an opposite second end, the first and second ends defining a longitudinal length of the channel;
   a source and a drain disposed on the first end and the second end of the channel, respectively;
   a gate disposed above the channel;
   an insulator interposed between the channel and the gate; and
   a substrate supporting the channel, the source and the drain, wherein the nonlinear electron-moving path is formed in a region overlapped with the gate,
   wherein the channel comprises a plurality of bent portions and wherein the bent portions are formed on the same side of a gate to form a U shape.

2. The thin film transistor of claim 1, wherein the channel is an Si-based channel.

3. The thin film transistor of claim 1, wherein the source and drain are positioned on same side of the gate.

4. The thin film transistor of claim 1, wherein a length of the nonlinear electron-moving path is greater than a width of the gate.

5. The thin film transistor of claim 1, wherein a direction of the nonlinear electron-moving path adjacent to the source is opposite to a direction of the nonlinear electron-moving path adjacent to the drain.

6. A thin film transistor comprising:
   a channel having a nonlinear electron-moving path, having at least one stepped portion of which a surface reflects and bounces electrons so that the nonlinear electron-moving path is extended in a same direction of a channel length of the channel, and having a first end and an opposite second end, the first and second ends defining a longitudinal length of the channel;
   a source and a drain disposed on the first end and the second end of the channel, respectively;
   a gate disposed above the channel;
   an insulator interposed between the channel and the gate; and
   a substrate supporting the channel, the source and the drain, wherein the nonlinear electron-moving path is formed in a region overlapped with the gate,
   wherein a channel width of the drain is narrower than that of the source.

7. The thin film transistor of claim 6, wherein the channel is an Si-based channel.

8. The thin film transistor of claim 6, wherein the source and drain are positioned on either side of the gate, respectively.

9. The thin film transistor of claim 6, wherein a length of the nonlinear electron-moving path is greater than a width of the gate.

10. An organic light-emitting display comprising:
    a substrate;
    a scanning signal line and a driving signal line disposed on the substrate in a matrix pattern;
    a switching transistor and a driving transistor disposed in a pixel region defined by the scanning signal line and the driving signal line, wherein the switching transistor is connected to the scanning signal line and the driving signal line and the driving transistor is driven by the switching transistor; and
    an organic light-emitting diode operated by the driving transistor,
    wherein the switching transistor comprises:
      a channel having a nonlinear electron-moving path, having at least one stepped portion of which a surface reflects and bounces electrons so that the nonlinear electron-moving path is extended in a same direction of a channel length of the channel, and having a first end and an opposite second end, the first and second ends defining a longitudinal length of the channel;
      a source and a drain disposed on the first end and the second end of the channel, respectively;
      a gate disposed above the channel;

an insulator interposed between the channel and the gate; and a substrate supporting the channel, the source and the drain, wherein the nonlinear electron-moving path is formed in a region overlapped with the gate.

11. The organic light-emitting display of claim 10, wherein the channel comprises a plurality of bent portions to form the nonlinear electron-moving path and wherein the bent portions are formed on either side of a gate to form a crank shape.

12. The organic light-emitting display of claim 10, wherein the channel comprises a plurality of bent portions and wherein the bent portions are formed on the same side of a gate to form a U shape.

13. The organic light-emitting display of claim 10, wherein a channel width of the drain is narrower than that of the source.

14. The organic light-emitting display of claim 10, wherein the channel is an Si-based channel.

15. The organic light-emitting display of claim 10, wherein a length of the nonlinear electron-moving path is greater than a width of the gate.

16. The organic light-emitting display of claim 11, wherein the source and drain are asymmetrically positioned with respect to each other on either side of the gate, respectively.

17. The organic light-emitting display of claim 12, wherein the source and drain are positioned on same side of the gate.

18. The organic light-emitting display of claim 12, wherein a direction of the nonlinear electron-moving path adjacent to the source is opposite to a direction of the nonlinear electron-moving path adjacent to the drain.

* * * * *